United States Patent [19]

Hawrylo et al.

[11] 3,945,902
[45] Mar. 23, 1976

[54] METALLIZED DEVICE AND METHOD OF FABRICATION

[75] Inventors: Frank Zygmunt Hawrylo, Trenton; Henry Kressel, Elizabeth, both of N.J.

[73] Assignee: RCA Corporation, New York, N.Y.

[22] Filed: July 22, 1974

[21] Appl. No.: 490,792

[52] U.S. Cl. .................. 204/192; 274/38; 427/444
[51] Int. Cl.² ......................................... C23C 15/00
[58] Field of Search ...................... 204/192, 298, 33

[56] References Cited
UNITED STATES PATENTS

| 3,021,271 | 2/1962 | Wehner | 204/192 |
|---|---|---|---|
| 3,325,393 | 6/1967 | Darrow et al. | 204/192 |
| 3,634,220 | 1/1972 | Goan | 204/164 |
| 3,661,747 | 5/1972 | Byrnes, Jr. | 204/192 |
| 3,699,034 | 10/1972 | Lins et al. | 204/192 |
| 3,717,563 | 2/1973 | Revitz et al. | 204/192 |
| 3,813,282 | 5/1974 | Masotti et al. | 161/164 |

OTHER PUBLICATIONS

"Surface Treatment of Aluminum," by Wernick & Pinner, 3rd Edition, Draper, Ltd., Teddington, England, 1964, pp. 175, 252–253, 345–346.

Primary Examiner—John H. Mack
Assistant Examiner—Aaron Weisstuch
Attorney, Agent, or Firm—Glenn H. Bruestle; Daniel N. Calder

[57] ABSTRACT

A diamond body and an oxide substrate are simultaneously sputter-etched such that the diamond body is cleaned and a layer of the sputtered oxide is deposited on the clean surface of the diamond body, then a metallic layer is deposited on the oxide layer. This provides a metallized diamond body whose metallic layer will adhere to the body.

6 Claims, 3 Drawing Figures

METALLIZED DEVICE AND METHOD OF FABRICATION

BACKGROUND OF THE INVENTION

This invention relates to a metallized body of crystalline material and to a method of fabricating. More specifically, the present invention relates to a diamond material that has been metallized and to the method for metallization of a diamond material.

In the past, it was difficult to metallize a crystalline diamond material so that the metallization would adhere to the material. In the prior art, sputtering techniques have been used for the metallization of crystalline material such as diamonds, but such techniques had several distinct disadvantages. Sputtering a metal onto a diamond surface, in the prior art, required the diamond being placed in an evacuated sputtering system in which the diamond was first sputter etched and then metallized. Both steps had to be performed consecutively in the evacuated sputtering system. The vacuum system could not be broken between process steps since to assure adhesion of the metal onto the diamond it is essential that the diamond surface be cleaned as a result of the sputter etching. In addition, since prior art metallization of a diamond material must be performed in a sealed sputtering system, the entire surface of the diamond is covered with a metallic layer, because it is not convenient to introduce a selective mask into the vacuum system to form a metallic pattern.

SUMMARY OF THE INVENTION

A metallized diamond device including a body of diamond material having a layer of an oxide material on the surface of the body. Such a metallized diamond device can be fabricated by a method of metallizing a body of crystalline material in which simultaneously a crystalline body is cleaned and an oxide layer is formed on the cleaned body. The metallic layer can be patterned by masking using photoresist technology. If however, the metallic layer is etched so as to form a pattern, a portion of the diamond surface may be exposed to the ambient and any further metallization onto the exposed surface is not possible without again sputter-etching the diamond surface. Sputter-etching the diamond a second time would remove all metallization initially formed on the diamond surface. Therefore, it would be most advantageous to have a method of metallizing a diamond in which metallization can be performed on the diamond after the diamond has been removed from the sputter-etching chamber.

DETAILED DESCRIPTION OF THE INVENTION

Figure 1:
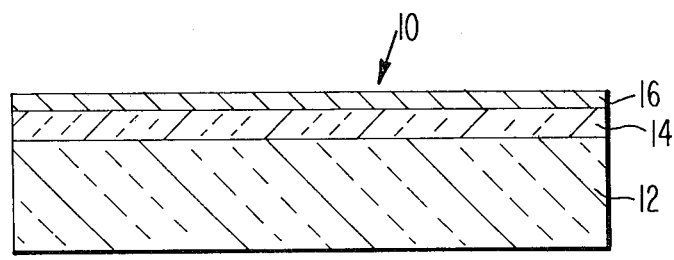
FIG. 1 is a cross-sectional view of the metallized body of diamond material of the present invention.

Referring to FIG. 1, a metallized device 10 consists of a body of diamond material 12 having an oxide layer 14 on a surface of the body 12. On the oxide layer 14 is a metallic layer 16. The oxide layer 14 is typically an oxide of silicon or aluminum, but silicon dioxide is preferred since it is used extensively in photoresist technology. The metallic layer 16 is typically gold with a layer of any good wetting agent, such as titanium or chromium, between the gold and the oxide layer 14, to assure adherence of the gold.

Figure 2:
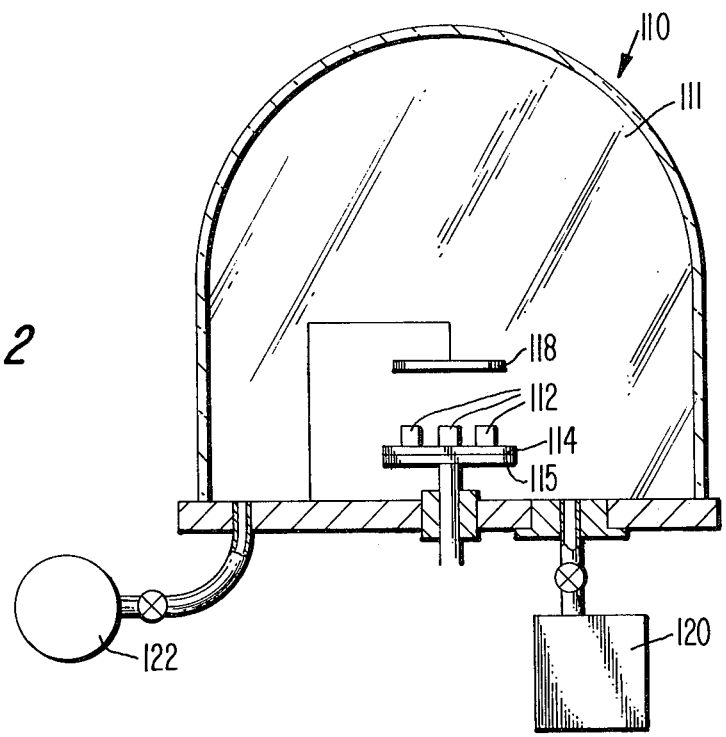
FIG. 2 is a cross-sectional view of an apparatus suitable for the operation of the method of the present invention.

Referring to FIG. 2, an apparatus suitable for carrying out the method of fabricating a metallized crystalline body such as the metallized device 10 is generally designated as 110. The apparatus 110 comprises a sputtering chamber 111 in which is a cathode plate 115 and an anode plate 118. The anode plate 118 is separated from and directly over the cathode plate 115. The plates 115 and 118 are typically of a metal such as brass. An oxide substrate 114 is placed on the cathode plate 115. Bodies of crystalline material 112, typically diamonds, are disposed onto the oxide substrate 114, between plates 115 and 118. The bodies of crystalline material 112 are the same as the body of crystalline material 12 in FIG. 1, and the oxide substrate 114 is of the same material as the oxide layer 14 in FIG. 1.

After the crystalline bodies 112 have been disposed on the substrate 114, the sputtering chamber 111 is closed and sealed, so as to be impervious to the ambient. Next, the sputtering chamber 111 is evacuated, by a vacuum pump 120, to approximately $5 \times 10^{-6}$ mm Hg. After evacuation of the sputtering chamber 111, the chamber 111 is back filled from a source 122 of a heavy noble gas. Usually, of the noble gases that can be used in sputtering the inert gas argon is preferred since it is both inexpensive and efficient as compared to other noble gases.

With the sputtering chamber 111 back filled with argon gas at a pressure suitable for sputtering, such as from 25 to 50 microns pressure, the cathode plate 115 and the anode plate 118 are electrically connected to an RF power source (not shown) such that the cathode plate 115 is at a negative potential compared to the anode plate 118. The RF voltage differential between the plates 115 and 118 must be sufficient for the operation of the sputtering process. That is to say, the RF voltage between the plates 116 and 118 must be at such a value as to ionize the argon atoms between the separated plates effecting a glow discharge therebetween, and then accelerate the argon ions toward the targets to be sputter-etched. The voltage potential difference between the plates 115 and 118 forms positive argon ions. Therefore, the argon ions will be attracted to and accelerated toward the cathode plate 115, striking the oxide substrate 114 and crystalline bodies 112.

The argon ions are large as compared to the atoms of the materials constituting the oxide substrate 114 and crystalline bodies 112. When the argon ions strike the oxide substrate 114 and crystalline bodies 112 they cause some of the atoms in the area of the striking ion to be ejected from the surfaces of the oxide substrate 114 and crystalline bodies 112. Some of the ejected crystalline atoms and oxide atoms will be attracted to the anode plate 118 and be deposited thereon. Since the sputtering rate of the oxide substrate 114 is greater than the sputtering rate of the bodies of crystalline material 112, at some time in the sputtering process a layer of oxide will form on the crystalline bodies 112. In the method of the present invention the oxide substrate 114 and crystalline bodies 112 are sputter-etched simultaneously and an oxide layer is deposited onto the surface of the crystalline bodies 112.

The atoms forming an oxide layer on the surface of the crystalline bodies 112 come from two sources. The first source is atoms which have been ejected from the surface of the oxide substrate 114 and which strike argon ions in the glow discharge and are reflected back toward the surfaces of the crystalline bodies 112. The second source is from those atoms which have been ejected from the oxide substrate 114 and have been deposited onto the anode plate 118. Some of these ejected atoms will in turn be ejected from the anode plate 118 and deposited on the crystalline bodies 112.

Typically, after about 2 hours of sputter etching at an RF-AC voltage differential of between 1400 and 1600 volts a layer of oxide material about 400 to 500 A in thickness has been deposited on the crystalline bodies 112. The crystalline bodies 112 are then removed from the sputtering chamber 111 and either metallized or placed in a storage for further metallization.

Since the body of diamond material 12, as shown in FIG. 1, is coated with an oxide layer 14, methods well known in the art, such as evaporation, can be used to form the metallic layer 16 on the oxide layer 14. Having the oxide layer 14 on the body of diamond material 12 improves the adherence of the metallic layer 16 to the metallized device 10, since an oxide, such as silicon dioxide, has a better adherent quality to both diamond and a metal, such as gold, than the gold has to the diamond. By the use of state of the art masking and photoresist techniques, the metallic layer 16 of FIG. 1 can be formed into many desired patterns.

Figure 3:
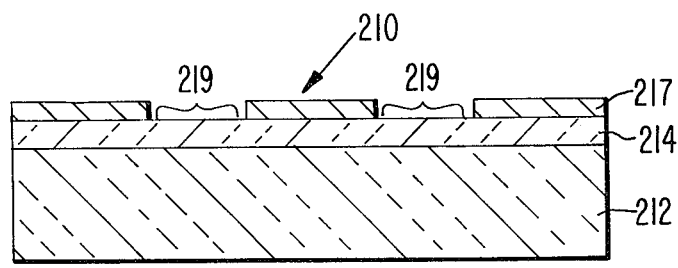
FIG. 3 is a cross-sectional view of the metallized body of diamond material of the present invention, having a patterned metallic layer.

Referring to FIG. 3, the metallized device 210 consists of a body of diamond material 212 having an oxide layer 214 on a surface thereof, and a patterned metallic layer 217 on the oxide layer 214. The body of diamond material 212 and the oxide layer 214 are the same as the body 12 and oxide layer 14, respectively, of the metallized device 10 of FIG. 1. Those portions of the oxide layer 214 which are exposed, because the metallic layer 217 is patterned, are designated as 219. If after the patterned metallic layer 217 is formed, the metallized device 210 is to again be metallized, it can be done with the method of the present invention since metallization on the exposed portion 219 of the oxide layer 214 and on the metallic layer 217 can be performed in the ambient. Unlike in the prior art methods of metallization, there is no need in the method of the present invention to again subject the device 210 to sputter etching before metallizing. The method of the present invention is far more flexible than that provided by prior art methods of metallization in a sealed sputtering system.

Therefore, the metallized device 10 and the method of the present invention, provides for a metallic layer on a diamond body which will not peel off from the body and a method of performing multi-metallic steps on crystalline bodies. A metallized crystalline material such as a diamond can be useful as a heat sink for many types of semiconductor devices where thermal dissipation is important. In addition, since a patterned metallic layer can be formed onto the metallized diamond, the present invention has an application for the stylus of phonographic devices.

We claim:

1. A method of preparing a body of crystalline material for subsequent metallization comprising the step of simultaneously sputter etching the surfaces of said crystalline body and an oxide substrate in order to clean said crystalline body and to provide an oxide layer on said body.

2. The method in accordance with claim 1 in which the body of crystalline material is mounted on said oxide substrate for sputter-etching.

3. The method in accordance with claim 2 in which the sputtering rate for said oxide substrate is greater than that of said body of crystalline material.

4. A method of metallizing a body of crystalline material comprising the steps of simultaneously sputter etching the surfaces of said crystalline body and an oxide substrate in order to clean said crystalline body and to provide an oxide layer on said body and subsequently depositing a metal layer on said oxide layer.

5. The method of metallizing a body of crystalline material in accordance with claim 4 in which said body is a diamond material.

6. The method of metallizing a body of crystalline material in accordance with claim 5 in which said oxide substrate is an oxide selected from the group consisting of oxides of silicon and oxides of aluminum.

* * * * *